United States Patent [19]
Betts et al.

[11] Patent Number: 5,243,627
[45] Date of Patent: Sep. 7, 1993

[54] SIGNAL POINT INTERLEAVING TECHNIQUE

[75] Inventors: William L. Betts, St. Petersburg; Edward S. Zuranski, Largo, both of Fla.

[73] Assignee: AT&T Bell Laboratories, Murray Hill, N.J.

[21] Appl. No.: 748,594

[22] Filed: Aug. 22, 1991

[51] Int. Cl.$^5$ .............................................. H04L 5/12
[52] U.S. Cl. ...................................... 375/39; 375/60; 375/99; 371/43
[58] Field of Search ....................... 375/39, 58, 60, 99; 371/43, 37.5, 2.1, 45; 341/81

[56] References Cited
U.S. PATENT DOCUMENTS

| | | | |
|---|---|---|---|
| 3,988,677 | 10/1976 | Fletcher et al. | 371/45 X |
| 4,677,624 | 6/1987 | Betts et al. | 375/39 |
| 4,945,549 | 7/1990 | Simon et al. | 375/53 |
| 5,029,185 | 7/1991 | Wei | 375/39 X |

Primary Examiner—Curtis Kuntz
Assistant Examiner—Tesfaldet Bocure
Attorney, Agent, or Firm—Ronald D. Slusky; Gerard A. deBlasi

[57] ABSTRACT

Viterbi decoder performance in a data communication system using 2N-dimensional channel symbols N>1 can be further enhanced by an interleaving technique which uses a distributed trellis encoder in combination with a signal point interleaver.

24 Claims, 4 Drawing Sheets

FIG. 5

|   |   | 4D SYMBOL | 4D SYMBOL | 4D SYMBOL | 4D SYMBOL | 4D SYMBOL | 4D SYMBOL |
|---|---|---|---|---|---|---|---|
| I | NOT INTERLEAVED ONE TRELLIS STAGE | $x_0^\alpha\ x_1^\alpha$ | $x_2^\alpha\ x_3^\alpha$ | $x_4^\alpha\ x_5^\alpha$ | $x_6^\alpha\ x_7^\alpha$ | $x_8^\alpha\ x_9^\alpha$ | $x_{10}^\alpha\ ...$ |
| II | NOT INTERLEAVED THREE TRELLIS STAGES | $x_0^\alpha\ x_1^\alpha$ | $x_2^\beta\ x_3^\beta$ | $x_4^\gamma\ x_5^\gamma$ | $x_6^\alpha\ x_7^\alpha$ | $x_8^\beta\ x_9^\beta$ | $x_{10}^\gamma\ ...$ |
| III | INTERLEAVED ONE TRELLIS STAGE | $x_0^\alpha\ x_{-1}^\alpha$ | $x_2^\alpha\ x_1^\alpha$ | $x_4^\alpha\ x_3^\alpha$ | $x_6^\alpha\ x_5^\alpha$ | $x_8^\alpha\ x_7^\alpha$ | $x_{10}^\alpha\ ...$ |
| IV | INTERLEAVED TWO TRELLIS STAGES | $x_0^\alpha\ x_{-1}^\beta$ | $x_2^\beta\ x_1^\alpha$ | $x_4^\alpha\ x_3^\beta$ | $x_6^\beta\ x_5^\alpha$ | $x_8^\alpha\ x_7^\beta$ | $x_{10}^\beta\ ...$ |
| V | INTERLEAVED THREE TRELLIS STAGES | $x_0^\alpha\ x_{-1}^\gamma$ | $x_2^\beta\ x_1^\alpha$ | $x_4^\gamma\ x_3^\beta$ | $x_6^\alpha\ x_5^\gamma$ | $x_8^\beta\ x_7^\alpha$ | $x_{10}^\gamma\ ...$ |

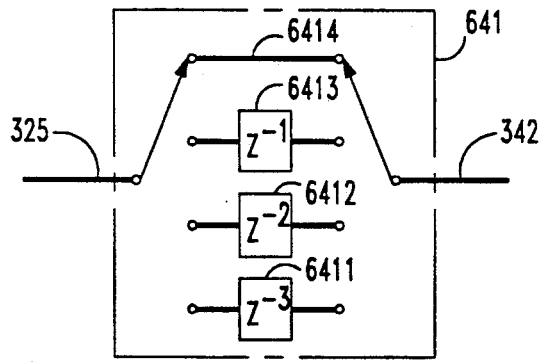

FIG. 6

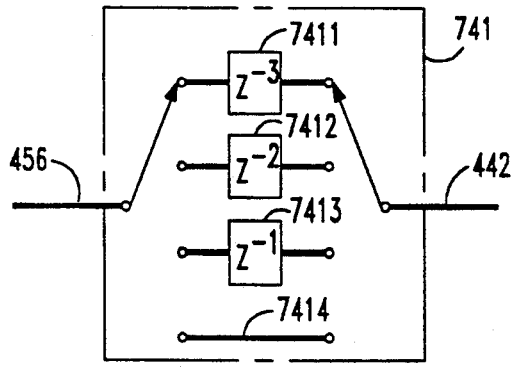

FIG. 7

SIGNAL POINT INTERLEAVING TECHNIQUE

BACKGROUND OF THE INVENTION

The present invention relates to the transmission of digital data over band-limited channels.

Over the years, the requirements of modern-day digital data transmission over band-limited channels—such as voiceband telephone channels—have resulted in a push for higher and higher bit rates. This push has led to the development and introduction of such innovations as adaptive equalization, multi-dimensional signal constellations, echo cancellation (for two-wire applications), and trellis coding. Today, the data rates achieved using these and other techniques are beginning to approach the theoretical limits of the channel.

It has been found that various channel impairments, whose effects on the achievable bit rate were relatively minor compared to, say, additive white Gaussian noise and linear distortion, have now become of greater concern. These include such impairments as nonlinear distortion and residual (i.e., uncompensated-for) phase jitter. Such impairments are particularly irksome in systems which use trellis coding. Indeed, it has been found that the theoretical improvement in Gaussian noise immunity promised by at least some trellis codes is not realized in real-world applications where these impairments are manifest. The principal reason this is so appears to be that the noise components introduced into the received signal samples are such as to worsen the effectiveness of the Viterbi decoder used in the receiver to recover the transmitted data.

U.S. Pat. No. 4,677,625, issued Jun. 30, 1987 to Betts et al, teaches a method and arrangement in which, through the use of a distributed trellis encoder/Viterbi decoder, the effects of many of these impairments can be reduced. The invention in the Betts et al patent recognizes that a part of the reason that the performance of the Viterbi decoder is degraded by these impairments is the fact that the noise components of channel symbols which closely follow one another in the transmission channel are highly correlated for many types of impairments. And it is that correlation which worsens the effect that these impairments have on the Viterbi decoder. Among the impairments whose noise is correlated in this way are impulse noise, phase "hits" and gain "hits." All of these typically extend over a number of adjacent channel symbols in the channel, and thus all result in channel symbol noise components which are highly correlated. The well-known noise enhancement characteristics of linear equalizers also induce correlated noise in adjacent channel symbols, as does uncompensated-for phase jitter. Also, the occurrence of one of the relatively high power points of the signal constellation can, in pulse code modulation (PCM) systems, for example, give rise to noise on adjacent channel symbols which, again, is correlated.

The Betts et al patent addresses this issue by distributing the outgoing data to a plurality of trellis encoders in round-robin fashion and interleaving the trellis encoder outputs on the transmission channel. In the receiver, the stream of received interleaved channel symbols is correspondingly distributed to a plurality of trellis decoders. Since the successive pairs of channel symbols applied to a particular trellis decoder are separated from one another as they traverse the channel, the correlation of the noise components of these channel symbol pairs is reduced from what it would have otherwise been.

SUMMARY OF THE INVENTION

In accordance with the present invention, it has been realized that the Viterbi decoder performance in a data communication system using 2N-dimensional channel symbols can be further enhanced by an interleaving technique which uses, in combination, a) the aforementioned distributed trellis encoder/Viterbi decoder technique and b) a signal point interleaving technique which causes the constituent signal points of the channel symbols to be non-adjacent as they traverse the channel.

In preferred embodiments of the invention, the interleaving is carried out in such a way that every $N^{th}$ signal point in the signal point stream traversing the channel is the $N^{th}$ signal point of a respective one of the channel symbols. This criterion enhances the accuracy with which the phase tracking loop in the receiver performs its function.

Also in preferred embodiments, we have found that the use of three parallel trellis encoders in conjunction with a signal point interleaving regime in which the signal points of each channel symbol are separated from one another by three signaling intervals (bauds) provides an optimum or near-optimum tradeoff between signal point/channel symbol separation and the decoding delay that is caused by the interleaving.

BRIEF DESCRIPTION OF THE DRAWING

In the drawing,

FIG. 5 is a signal point timing/sequencing chart helpful in explaining the principles of the present invention;

FIG. 6 is a signal point interleaver which can be used in the transmitter of FIG. 3 to interleave the signal points of eight-dimensional channel symbols; and FIG. 7 is a signal point deinterleaver which can be used in the receiver of FIG. 4 to deinterleave the signal points of eight-dimensional channel symbols.

DETAILED DESCRIPTION

Figure 1:
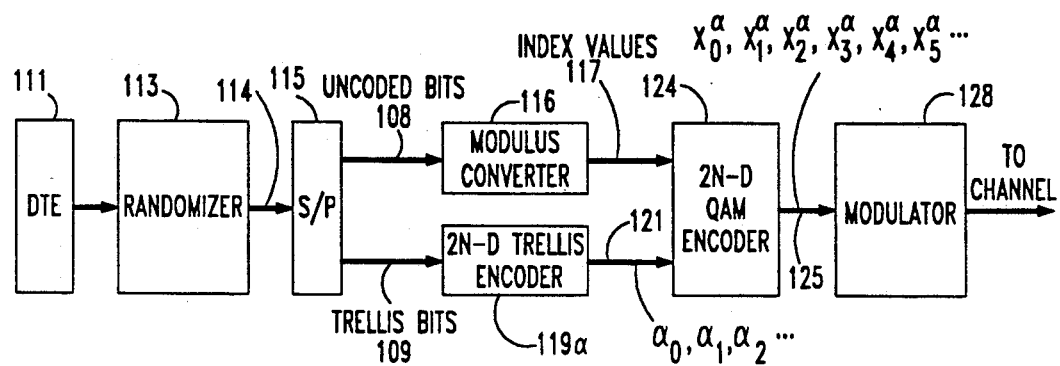
FIG. 1 is a block diagram of the transmitter section of a prior art modem.

FIG. 1 depicts the transmitter section of a prior art modem employing a 2N-dimensional signaling scheme, $N \geq 1$. The modem receives input information in the form of a serial bit stream from data terminal equipment (DTE) 111—illustratively a host computer. That bit stream is then scrambled, or randomized, by randomizer 113 whose output bits are provided in serial form to serial-to-parallel (S/P) converter 115.

Serial-to-parallel converter 115, in turn, provides, during each of a succession of symbol intervals (comprised of N baud intervals), some predetermined number of parallel bits on lead 109 and some number of parallel bits on lead 108. (It will be appreciated that whenever bits are provided in parallel in the modem, separate leads are required to carry each of the bits.) The bits on lead 109 are applied to trellis encoder 119a, and are referred to as the "trellis bits." The bits on lead 108 are applied to modulus converter 116, and are referred to as the "uncoded bits."

Figure 2:
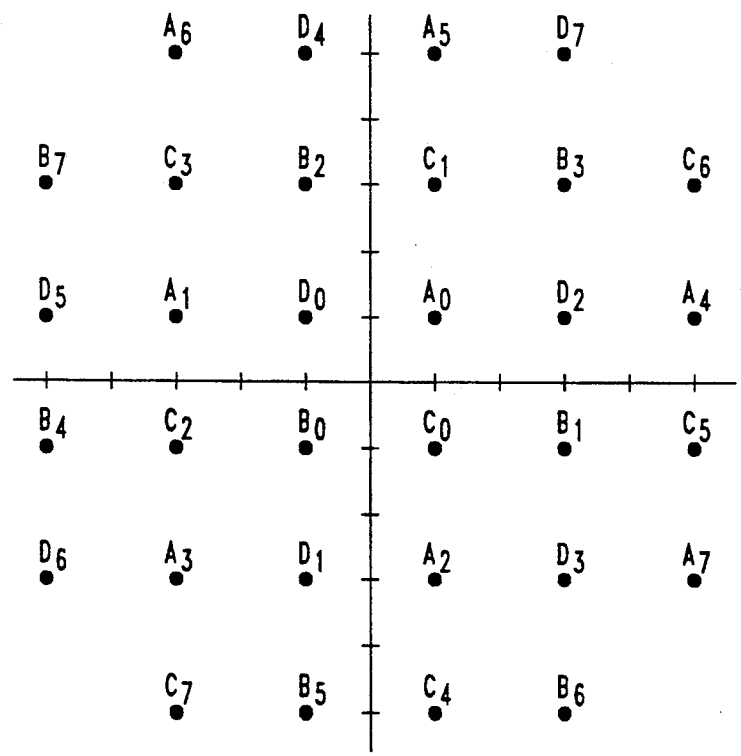
FIG. 2 is shows a signal constellation used by the transmitter of FIG. 1.

To better understand how trellis encoder 119α and modulus converter 116 work, reference is made to FIG. 2, which shows the two-dimensional signal constellation that forms the basis of the 2N-dimensional signaling scheme illustratively used by the modem. This constellation is comprised of 32 signal points, which are divided into four subsets, A through D, each comprised of eight signal points. The eight points of subset A are explicitly labeled as $A_0$ through $A_7$. It may be noted that subsets C, B and D can be arrived at by clockwise rotation of subset A by 90, 180 and 270 degrees, respectively. (Conventional differential encoding circuitry within trellis encoder 119α exploits this symmetry.) For reference, a single signal point of each of those subsets is also shown on FIG. 2.

Consider, first, the case of N=1, i.e., a two-dimensional signaling scheme. In this case, one trellis bit on lead 109 would be expanded to two bits by trellis encoder 119α on lead 121. The four possible values of those three bits 00, 01, 10, and 11 identify subsets A, B, C and D, respectively. The successive 2-bit words on lead 121 are represented as $\alpha_n$, n=0,1,2..., where n is an index that advances at the baud rate. At the same time, three parallel bits would be provided on lead 108. These are converted by modulus converter 116 into an index having a value within the range (decimal) 0 to 7. The index value, represented in binary form on lead 117, selects a particular signal point from the subset identified on lead 121. Thus if lead 121 carries the two bits 00 while lead 117 carries the three bits 001, then signal point $A_1$ of the FIG. 2 constellation has been selected. The words on leads 117 and 121 are applied to QAM encoder 124 which generates, on lead 125, values representing the I (in-phase) and Q (quadrature-phase) components of signal point $A_1$. The signal point generated on lead 125 in the $n^{th}$ baud interval is denoted $X_n^\alpha$, which is passed on to modulator 128 to generate a passband line signal which is applied to the communication channel. The superscript, $\alpha$, indicates that the trellis encoder that was used to identify the subset for any particular signal point was trellis encoder 119α. That is, of course, a trivial notation as far as FIG. 1 goes inasmuch as trellis encoder 119α is the only trellis encoder in the modem. However, it is useful to introduce this notation because more than one trellis encoder stage is used in preferred embodiments of modems incorporating the principles of the present invention as shown in later FIGS.

In the case of N>1, the operation is similar. Now, however, the words on lead 109 are used by trellis encoder 119α to sequentially identify on lead 121 N subsets, while the words on lead 108 are used to generate N corresponding index values on lead 117. The N signal points identified in this way are the component signal points of a 2N-dimensional channel symbol, the first such symbol being comprised of the signal points $X_0^\alpha, \ldots X_{(N-1)}^\alpha$. For example, a modem in which the transmitter of FIG. 1 could be used may be a 14,400 bit per second modem using four-dimensional coding (i.e., N=2) and a baud rate of 3200. In this case, nine bits from S/P converter 115 are used for each four-dimensional symbol. Specifically, three parallel bits on lead 109 are expanded into four bits on lead 121 to identify a pair of subsets while six bits on lead 108 are used to select particular signal points from those two subsets.

Those two signal points are thereupon communicated over the channel by QAM encoder 124 and modulator 128 as described above.

Note that, implementationally, the 2N-dimensional channel symbol is generated by having the trellis encoder identify, interdependently, N subsets of the two-dimensional constellation of FIG. 2, then select a two-dimensional signal point from each of the subsets thus identified. The concatenation of the N two-dimensional signal points thus selected is the desired 2N-dimensional channel symbol. This process, however, can be understood as involving the direct selection of a 2N-dimensional channel symbol. Viewed in this context, the set of all possible combinations of N of the two-dimensional subsets identified by N successive trellis encoder outputs can be understood to be a set of 2N-dimensional subsets of a 2N-dimensional constellation, the latter being comprised of all possible combinations of N of the signal points of the two-dimensional constellation. A succession of N outputs from the trellis encoder identifies a particular one of the 2N-dimensional subsets and a succession of N outputs from the modulus converter selects a particular 2N-dimensional signal point from the identified 2N-dimensional subset.

Modulus converter 116 is illustratively of the type disclosed in co-pending, commonly-assigned U.S. patent application Ser. No. 588,658 filed Sep. 26, 1990 and allowed on May 21, 1991, hereby incorporated by reference. Modulus converter 116 provides the modem with the ability to support data transmission at various different bit rates. Assume, for example, that the rate at which bits are provided by DTE 111 decreases. The serial-to-parallel converter will continue to provide its outputs on leads 108 and 109 at the same baud rate as before. However, the upper limit of the range of index values that are provided by modulus converter 116 on lead 117 will be reduced, so that, effectively, each of the four subsets A through D, instead of having eight signal points, will have some smaller number. Conversely if the rate at which bits are provided by DTE 111 should increase over that originally assumed, the upper limit of the range of index values, and thus the number of parallel bits, that appear on lead 117 will be increased beyond eight and the constellation itself will be expanded to accommodate the larger number of signal points thus being selected. As an alternative to using a modulus converter, fractional bit rates can be supported using, for example, the technique disclosed in L. Wei, "Trellis-Coded Modulation with Multidimensional Constellations," *IEEE Trans. on Communication Theory*, Vol. IT-33, No. 4, July 1987, pp. 483-501.

Figure 3:
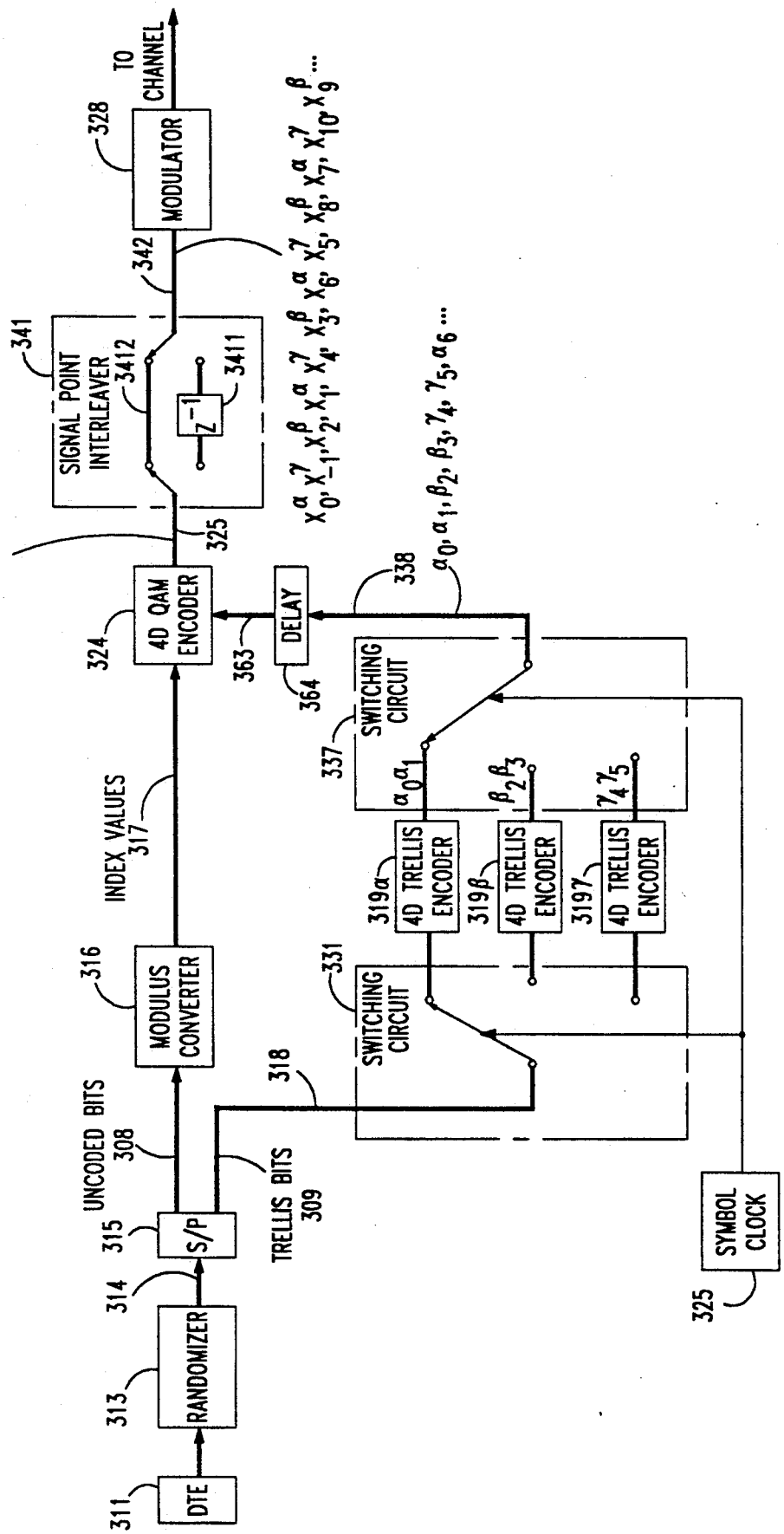
FIG. 3 is a block diagram of the transmitter section of a modem employing four-dimensional channel symbols and embodying the principles of the invention.

Turning now to FIG. 3, the transmitter portion of a modem embodying the principles of the invention is shown. This embodiment illustratively uses the aforementioned four-dimensional, i.e., N=2, signaling scheme. Many of the components are similar to those shown in FIG. 1. Thus, in particular, the transmitter of FIG. 3—which receives its input information in the form of a stream of input bits from DTE 311—includes randomizer 313, which supplies its output, on lead 314, to S/P converter 315. The latter outputs uncoded bits to modulus converter 316. The transmitter further includes four-dimensional QAM encoder 324 and modulator 328. The trellis bits, on lead 309, are provided not to a standard single trellis encoder, but to a distributed trellis encoder comprised of three trellis encoder stages: trellis encoder stage 319α, trellis encoder stage 319β, and trellis encoder stage 319γ.

Such a distributed trellis encoder, which is described in the aforementioned Betts et al patent, generates a plurality of streams of trellis encoded channel symbols in response to respective portions of the input information. Specifically, a three-bit word on lead 309 is supplied to trellis encoder stage 319$\alpha$. The next three-bit word on lead 309 is supplied to trellis encoder stage 319$\beta$. The next three-bit word is supplied to trellis encoder stage 319$\gamma$, and then back to trellis encoder stage 319$\alpha$. This distribution of the trellis bits to the various trellis encoder stages is performed by switching circuit 331 operating under the control of symbol clock 325. The initial data word outputs of the trellis encoders are subset identifiers $\alpha_0$ and $\alpha_1$ for encoder stage 319$\alpha$, $\beta_2$ and $\beta_3$ for encoder stage 319$\beta$, and $\gamma_4$ and $\gamma_5$ for encoder stage 319$\gamma$, followed by $\alpha_6$ and $\alpha_7$ for encoder stage 319$\alpha$, and so forth. These are supplied to four-dimensional QAM encoder 324 by switching circuit 337—also operating under the control of symbol clock 325—on lead 338 through a one-symbol delay 364 and lead 363, in order to compensate for a one-symbol delay caused by modulus converter 316. Thus, the stream of subset identifiers on lead 338 is $\alpha_0, \alpha_1, \beta_2, \beta_3, \gamma_4, \gamma_5, \alpha_6$ . . . . Using the notation introduced above, then, the output of encoder 324 on lead 325 is the stream of signal points $X_0^\alpha, X_1^\alpha, X_2^\beta, X_3^\beta, X_4^\gamma, X_5^\gamma, X_6^\alpha$ . . . , which is comprised of three interleaved streams of trellis encoded channel symbols, these streams being $X_0^\alpha, X_1^\alpha, X_6^\alpha, X_7^\alpha, X_{12}^\alpha \ldots$; $X_2^\beta, X_3^\beta, X_8^\beta, X_9^\beta, X_{14}^\beta \ldots$; and $X_4^\gamma, X_5^\gamma, X_{10}^\gamma, X_{11}^\gamma, X_{16}^\gamma \ldots$ . These, in turn, are supplied, in accordance with the invention, to signal point interleaver 341 which applies alternate ones of the signal points applied thereto to lead 3412—which signal points appear immediately at the interleaver output on lead 342—and to one-symbol ($Z^{-1}$) delay element 3411, which appear on lead 342 after being delayed therein by one symbol interval. The resulting interleaved stream of trellis encoded signal points is $X_0^\alpha, X_{-1}^\gamma, X_2^\beta, X_1^\alpha, X_4^\gamma, X_3^\beta, X_6^\alpha, X_5^\gamma, X_8^\beta, X_7^\alpha, X_{10}^\gamma, X_9^\beta \ldots$ (the signal point $X_{-1}^\gamma$ being, of course, the signal point applied to interleaver 341 just ahead of signal point $X_0^\alpha$).

A discussion and explanation of how the interleaving just described is advantageous is set forth hereinbelow. In order to fully set the stage for that explanation, however, it will be first useful to consider the receiver section of a modem which receives the interleaved signal point stream.

Figure 4:
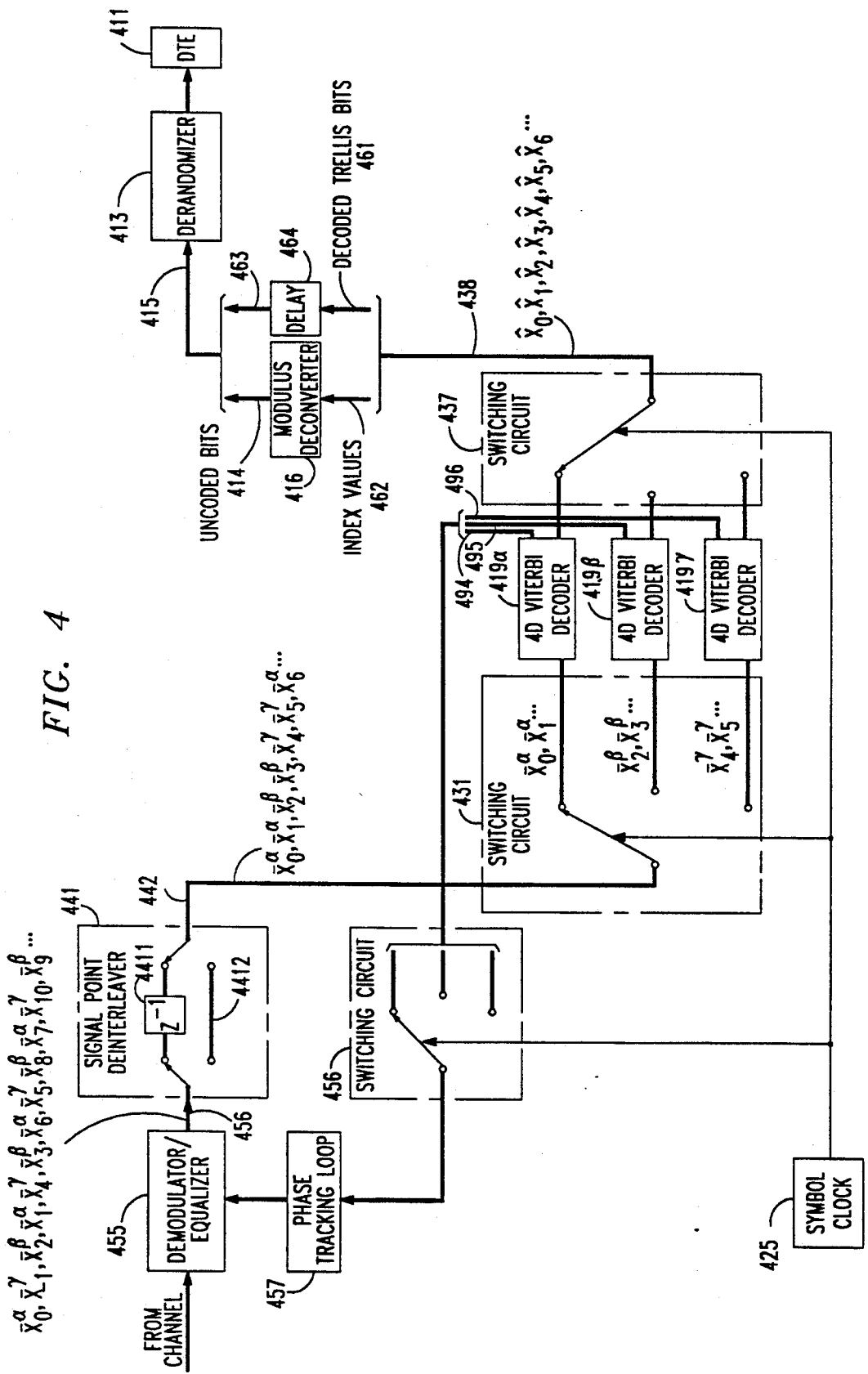
FIG. 4 is a block diagram of the receiver section of a modem embodying the principles of the invention which processes the received four-dimensional channel symbols generated by the transmitter of FIG. 3.

Thus referring to FIG. 4, the line signal transmitted by the transmitter of FIG. 3 is received from the channel and applied to demodulator/equalizer 455 which, in conventional fashion—including an input from phase tracking loop 457—generates a stream of outputs on lead 456 representing the demodulator/equalizer's best approximation of the values of the I and Q components of the signal points of the transmitted interleaved signal point stream. These outputs are referred to herein as the "received signal points." (Due to distortion and other channel impairments that the demodulator/equalizer is not able to compensate for, the I and Q components of the received signal points, instead of having exact integer values, can have any value. Thus a transmitted signal point having coordinates (3, −5) may be output by the demodulator/equalizer as the received signal point (2.945, −5.001).) The stream of received signal points on lead 456 is denoted $\bar{X}_0^\alpha, \bar{X}_{-1}^\gamma, \bar{X}_2^\beta, \bar{X}_1^\alpha, \bar{X}_4^\gamma, \bar{X}_3^\beta, \bar{X}_6^\alpha, \bar{X}_5^\gamma, \bar{X}_8^\beta, \bar{X}_7^\alpha, \bar{X}_{10}^\gamma, \bar{X}_9^\beta \ldots$.

The successive received signal points are deinterleaved in signal point deinterleaver 441, which provides the opposite function to interleaver 341 in the transmitter. The output of deinterleaver 441 on lead 442 is thus $\bar{X}_0^\alpha, \bar{X}_1^\alpha, \bar{X}_2^\beta, \bar{X}_3^\beta, \bar{X}_4^\gamma, \bar{X}_5^\gamma, \bar{X}_6^\alpha, \ldots$, etc. (Although not explicitly shown in the drawing, the same well-known techniques used in modems of this general kind to identify within the stream of received signal points the boundaries between successive symbols is used to synchronize the operation of signal point deinterleaver 441 to ensure that received signal points $\bar{X}_0^\alpha, \bar{X}_2^\beta, \bar{X}_4^\gamma$ . . . are applied to delay element 4411 while received signal points $\bar{X}_1^\alpha, \bar{X}_3^\beta, \bar{X}_5^\gamma$ . . . are applied to lead 4412.)

The received signal points on lead 442 are then distributed by switching circuit 431 under the control of symbol clock 425 to a distributed Viterbi decoder comprised of 4D Viterbi decoder stages 419$\alpha$, 419$\beta$ and 419$\gamma$. Specifically, received signal points $\bar{X}_0^\alpha$ and $\bar{X}_1^\alpha$ are applied to decoder stage 419$\alpha$; received signal points $\bar{X}_2^\beta$ and $\bar{X}_3^\beta$ are applied to decoder stage 419$\beta$; and received signal points $\bar{X}_4^\gamma$ and $\bar{X}_5^\gamma$ are applied to decoder stage 419$\gamma$. The outputs of the three decoder stages are then combined into a serial stream on lead 438 by switching circuit 437, also operating under the control of symbol clock 425. Those outputs, representing decisions as to the values of the transmitted signal points, are denoted $\hat{X}_0, \hat{X}_1, \hat{X}_2, \hat{X}_3, \hat{X}_4, \hat{X}_5, \hat{X}_6, \ldots$, the $\alpha, \beta$ and $\gamma$ superscripts no longer being needed.

In conventional fashion, the bits that represent each of the decisions on lead 438 can be divided into bits that represent a) the trellis bits that appeared on transmitter lead 309 and b) the index values that appeared on transmitter lead 317. Those two groups of bits are provided in the receiver on leads 461 and 462, respectively. The latter group of bits are deconverted by modulus deconverter 416 (also disclosed in the aforementioned '658 patent application) back to uncoded bit values on lead 414. The operation of the modulus deconverter imparts a one-symbol delay to the bits on lead 414. Accordingly, the bits on lead 461 are caused to be delayed by one symbol by delay element 464. The resulting combined bits on lead 415 thus represent the stream of bits that appeared at the output of randomizer 313 in the transmitter. These are derandomized in the receiver by derandomizer 413 and the resulting derandomized bit stream is applied to DTE 411 which may be, for example, a computer terminal.

Referring to FIG. 5, one can see the improvement that is achieved by the present invention.

Line I shows the stream of output signal points generated and launched into the channel using one stage of trellis encoding and no signal point interleaving. This is, of course, the prior art arrangement shown in FIG. 1. Line II shows the effect of providing a three-stage distributed trellis encoder but still no signal point interleaving. This is the arrangement shown in the aforementioned Betts et al patent. Note that the signal points of each channel symbol operated on by a particular trellis encoder stage are adjacent in the output signal point stream. For example, the second signal point of the symbol $X_0^\alpha X_1^\alpha$—namely signal point $X_1^\alpha$—is separated by five baud intervals from the first (closer) signal point of the symbol $X_6^\alpha X_7^\alpha$—namely signal point $X_6^\alpha$. As noted earlier, such separation is advantageous because the channel symbols which are processed one after the other in a particular Viterbi decoder stage have noise components which are not highly correlated.

Note, however, that the individual signal points of each channel symbol, e.g., $X_0^\alpha$ and $X_1^\alpha$, are adjacent to one another as they pass through the channel; and since all the signal points of a channel symbol must be processed serially in the same Viterbi decoder stage, this means that the Viterbi decoder must process adjacent signal points that have highly correlated noise components.

It is to this end that signal point interleaver 341 is included within the transmitter in accordance with the invention. Firstly, it may be noted from Line III that using the signal point interleaver without the distributed trellis encoder—an arrangement not depicted in the drawing—will, advantageously, cause the signal points from the same channel symbol to be non-adjacent. Moreover, there is further advantage in that a pair of channel symbols processed serially by Viterbi decoder stage 419α traverses the channel separated by five baud intervals rather than three, thereby providing greater decorrelation of the noise components thereof. Compare, for example, the span of baud intervals occupied by signal points $X_0^\alpha$ and $X_1^\alpha$, $X_2^\alpha$ and $X_3^\alpha$ in Line I and the span of baud intervals occupied by the same signal points in Line III. Disadvantageously, however, the use of a single trellis encoding stage brings back the problem that the distributed trellis encoder solves, as described above. Thus, for example, although signal points $X_0^\alpha$ and $X_1^\alpha$, which are from the same channel symbol, are separated from one another when traversing the channel, we find that, disadvantageously, signal points $X_2^\alpha$ and $X_1^\alpha$, which are signal points from two different channel symbols which will be processed serially by the Viterbi decoder, traverse the channel adjacent to one another.

Line IV shows that using the signal point interleaver with a two-stage trellis encoder—also an arrangement not depicted in the drawing—provides some improvement. Firstly, it may be noted that, as in Line III, signal points from the same channel symbol remain separated by three baud intervals. Additionally, pairs of channel symbols processed sequentially by a given Viterbi decoder stage—such as the channel symbols comprised of signal points $X_0^\alpha$ and $X_1^\alpha$, $X_4^\alpha$ and $X_5^\alpha$—are still non-adjacent and, indeed, are now separated by seven baud intervals, which is even greater than the separation of five baud intervals provided in Line III. Moreover, certain signal points that traverse the channel adjacent to one another and which are from channel symbols which would have been decoded sequentially in the one-trellis-encoding-stage case are, in the two-trellis-encoding-stage case of Line IV, processed by different Viterbi decoding stages. Signal points $X_2^\beta$ and $X_1^\alpha$ are such a pair of signal points. Note, however, that, disadvantageously, signal points $X_1^\alpha$ and $X_4^\alpha$ traverse the channel serially, and are from channel symbols which are serially processed by the "α" Viterbi decoder stage.

Referring, however, to Line V, which depicts the stream of signal points output by the transmitter of FIG. 3, it will be seen that, in accordance with the invention, there is still a non-adjacency—indeed, a separation of at least three baud intervals—between a) the signal points which belong to any particular channel symbol (and which, therefore, are processed serially by a particular Viterbi decoder stage) and b) the signal points which belong to channel symbols which are processed serially by a Viterbi decoder stage. Thus, for example, signal points $X_1^\alpha$ and $X_4^\gamma$ are now processed by different Viterbi decoder stages. Moreover, pairs of channel symbols processed sequentially by a given Viterbi decoder stage—such as the channel symbols comprised of signal points $X_0^\alpha$ and $X_1^\alpha$, $X_6^\alpha$ and $X_7^\alpha$—are now separated by none baud intervals.

Using more than three trellis encoder stages in the distributed trellis encoder and/or a signal point interleaver that separates signal points from the same channel symbol by more than three baud intervals would provide even greater separation and could, therefore, potentially provide even greater improvement in Viterbi decoding. However, such improvement comes at a price—that price being increased decoding delay—particularly as the number of trellis encoders is increased beyond three. An engineering trade-off can be made, as suits any particular application.

Moreover, it is desirable for the signal point interleaver to provide a sequence in which every $N^{th}$ signal point in the interleaved signal point stream is the $N^{th}$ signal point of a channel symbol. (The reason this is desirable is described in detail hereinbelow.) In the case of an N=2, four-dimensional signaling scheme, this means that every second, that is "every other," signal point in the interleaved stream is the second signal point of the channel symbol from which it comes. In the case of an N=4, eight-dimensional signaling scheme, this means that every fourth signal point in the interleaved stream is the fourth signal point of the channel symbol from which it comes. Indeed, this criterion is in fact satisfied in the embodiment of FIG. 3. Note that each one of signal points $X_0^\alpha$, $X_2^\beta$, $X_4^\gamma$, $X_6^\alpha$, ..., which appear as every other signal point in the interleaved stream, is the second signal point of one of the four-dimensional channel symbols. Note that not all rearrangements of the signal points will, in fact, satisfy this criterion, such as, if the two signal points of a channel symbol are separated by two, rather than three, baud intervals.

Satisfying the above criterion is advantageous because it enhances the accuracy with which phase tracking loop 457 performs its function. This is so because the arrival of an $N^{th}$ signal point of a given symbol means that all the signal points comprising that channel symbol have arrived. This, in turn, makes it possible to form a decision as to the identity of that channel symbol by using the minimum accumulated path metric in the Viterbi decoder stages. (Those decisions are fed back to the tracking loop by decoder stages 419α, 419β 419γ on leads 494, 495 and 496, respectively, via switching circuit 456.) Without having received all of the signal points of a channel symbol, one cannot take advantage of the accumulated path metric information but, rather, must rely on the so-called raw sliced values, which is less accurate. By having every $N^{th}$ signal point in the interleaved stream be the $N^{th}$ signal point of a channel symbol, we are guaranteed that the time between adjacent such path metric "decisions" supplied to the phase tracking loop is, advantageously, never more than N baud intervals.

The foregoing merely illustrates the principles of the invention. Thus although the illustrative embodiment utilizes a four-dimensional signaling scheme, the invention can be used with signaling schemes of any dimensionality. In the general, 2N-dimensional, case each stage of the distributed trellis encoder would provide N two-dimensional subset identifiers to switching circuit 337 before the latter moves on to the next stage. And, of course, each stage of the distributed Viterbi decoder would receive N successive received signal points. The distributed trellis encoder and distributed Viterbi decoder can, however, continue to include three trellis encoders and still maintain, independent of the value of N, a separation of three baud intervals in the channel between signal points that are from channel symbols that are adjacent in the trellis encoder. If a greater separation of such signal points is desired, more stages can be added to the distributed trellis encoder/Viterbi decoder, just as was noted above for the four-dimensional case. However, when dealing with 2N-dimensional signaling where $N>2$, it is necessary to add additional delay elements to the signal point interleaver/deinterleaver in order to maintain a three-baud-interval separation among the signal points from any given channel symbol.

Consider, for example, the case of $N=4$, i.e., an eight-dimensional case. Looking again at FIG. 3, the three (8D) stages of the distributed trellis encoder would generate the three streams of subset identifiers $\alpha_0 \alpha_1 \alpha_2 \alpha_3 \alpha_{12} \ldots$, $\beta_4 \beta_5 \beta_6 \beta_7 \beta_{16} \ldots$, and $\gamma_8 \gamma_9 \gamma_{10} \gamma_{11} \gamma_{20} \ldots$, respectively. This would lead to the following stream of signal points of eight-dimensional trellis encoded channel symbols at the output of the QAM encoder on lead 325: $X_0^\alpha X_1^\alpha X_2^\alpha X_3^\alpha X_4^\beta X_5^\beta X_6^\beta X_7^\beta X_8^\gamma X_9^\gamma X_{10}^\gamma X_{11}^\gamma X_{12}^\alpha \ldots$ Signal point interleaving could be carried out by substituting signal point interleaver 641 of FIG. 6 for interleaver 341. Interleaver 641, in addition to direct connection 6414, includes one-, two-, and three-symbol delay elements 6413, 6412 and 6411, respectively.

The signal points on lead 325, after passing through interleaver 641, would appear on lead 342 in the following order: $X_0^\alpha X_{-3}^\gamma X_{-6}^\beta X_{-9}^\alpha X_4^\beta X_1^\alpha X_{-2}^\gamma X_{-5}^\beta X_8^\gamma X_5^\beta X_2^\alpha X_{-1}^\gamma X_{12}^\alpha X_9^\gamma X_6^\beta X_3^\alpha X_{16}^\beta X_{13}^\alpha X_{10}^\gamma X_7^\beta \ldots$ where signal points with negative subscripts are, of course, signal points that arrived before signal point $X_0^\alpha$ and were already stored in the delay elements 6411, 6412 and 6413. Examination of this signal point stream will reveal that there is either a three- or five-baud separation between signal points of channel symbols that are processed sequentially by the same trellis encoder stage, e.g., $X_3^\alpha$ and $X_{12}^\alpha$; that adjacent signal points of any one channel symbol, e.g., $X_0^\alpha$ and $X_1^\alpha$, are separated by five baud intervals; and that the four signal points comprising any particular one channel symbol are separated by fifteen baud intervals.

FIG. 7 shows the structure of a deinterleaver 741 that could be used in the receiver of FIG. 4 in place of deinterleaver 441 in order to restore the signal points of the eight-dimensional channel symbols to their original order. This structure, which is the inverse of interleaver 641, includes delay stages 7411, 7412 and 7413, as well as direct connection 7414.

It will be appreciated that, although various components of the modem transmitter and receiver are disclosed herein for pedagogic clarity as discrete functional elements and indeed—in the case of the various switching circuits—as mechanical elements, those skilled in the art will recognize that the function of any one or more of those elements could be implemented with any appropriate available technology, including one or more appropriately programmed processors, digital signal processing (DSP) chips, etc. For example, multiple trellis encoders and decoders can be realized using a single program routine which, through the mechanism of indirect addressing of multiple arrays within memory, serves to provide the function of each of the multiple devices.

It will thus be appreciated that those skilled in the art will be able to devise numerous arrangements which, although not explicitly shown or described herein, embody the principles of the invention and are within its spirit and scope.

We claim:

1. Apparatus for forming a stream of trellis encoded signal points in response to input information, said apparatus comprising means for generating a plurality of streams of trellis encoded channel symbols in response to respective portions of said input information, each of said channel symbols being comprised of a plurality of signal points, and means for interleaving the signal points of said generated channel symbols to form said stream of trellis encoded signal points, said interleaving being carried out in such a way that the signal points of each channel symbol are non-adjacent in said stream of trellis encoded signal points and such that the signal points of adjacent symbols in any one of said channel symbol streams are non-adjacent in said stream of trellis encoded signal points.

2. The apparatus of claim 1 wherein said means for generating generates three of said streams of trellis encoded channel symbols, and wherein said means for interleaving causes there to be interleaved between each of the signal points of each channel symbol at least two signal points from other channel symbols of said streams of trellis encoded channel symbols.

3. The apparatus of claim 1 wherein said channel symbols are 2N-dimensional channel symbols, $N>1$, and wherein said means for interleaving causes every $N^{th}$ signal point in said interleaved signal point stream to be the $N^{th}$ signal point of a respective one of said channel symbols.

4. The apparatus of claim 2 wherein said channel symbols are 2N-dimensional channel symbols, $N>1$, and wherein said means for interleaving causes every $N^{th}$ signal point in said interleaved signal point stream to be the $N^{th}$ signal point of a respective one of said channel symbols.

5. A modem comprising means for receiving a stream of input bits, means for dividing said stream of input bits into a stream of uncoded bits and a plurality of streams of trellis bits, means for independently trellis encoding each of said plurality of streams of trellis bits to generate respective streams of data words each identifying one of a plurality of predetermined subsets of the channel symbols of a predetermined 2N-dimensional constellation, N being an integer greater than unity, each of said channel symbols being comprised of a plurality of signal points, means for selecting an individual channel symbol from each identified subset in response to said stream of uncoded bits to form a stream of channel symbols, and means for generating a stream of output signal points, said signal point stream being comprised of the signal points of the selected channel symbols, the signal points of said signal point stream being sequenced in such a way that signal points that are either a) part of the same channel symbol, or b) part of channel symbols that are adjacent to one another in said channel symbol stream, are separated in said output stream by at least one other signal point.

6. The apparatus of claim 5 wherein said trellis encoding means includes a plurality of trellis encoder stage means for trellis encoding respective ones of said streams of trellis bits.

7. The apparatus of claim 5 wherein said means for selecting includes means for modulus converting said stream of uncoded bits.

8. The apparatus of claim 5 wherein said channel symbols are 2N-dimensional channel symbols, $N>1$, and wherein said means for generating causes every $N^{th}$ signal point in said stream of output signal points to be the $N^{th}$ signal point of a respective one of said channel symbols.

9. Receiver apparatus for recovering information from a received stream of trellis encoded signal points, said signal points having been transmitted to said receiver apparatus by transmitter apparatus which generates said signal points by generating a plurality of streams of trellis encoded channel symbols in response to respective portions of said information, each of said channel symbols being comprised of a plurality of signal points, and by interleaving the signal points of said generated channel symbols to form said stream of trellis encoded signal points, said interleaving being carried out in such a way that the signal points of each channel symbol are non-adjacent in said stream of trellis encoded signal points and such that the signal points of adjacent symbols in any one of said channel symbol streams are non-adjacent in said stream of trellis encoded signal points, said receiver apparatus comprising
means for deinterleaving the interleaved signal points to recover said plurality of streams of trellis encoded channel symbols, and
a distributed Viterbi decoder for recovering said information from the deinterleaved signal points.

10. The apparatus of claim 9 further comprising
a phase tracking loop, and
means for adapting the operation of said phase tracking loop in response to minimum accumulated path metrics in said distributed Viterbi decoder.

11. A method for forming a stream of trellis encoded signal points in response to input information, said method comprising the steps of
generating a plurality of streams of trellis encoded channel symbols in response to respective portions of said input information, each of said channel symbols being comprised of a plurality of signal points, and
interleaving the signal points of said generated channel symbols to form said stream of trellis encoded signal points, said interleaving being carried out in such a way that the signal points of each channel symbol are non-adjacent in said stream of trellis encoded signal points and such that the signal points of adjacent symbols in any one of said channel symbol streams are non-adjacent in said stream of trellis encoded signal points.

12. The method of claim 11 wherein said generating step generates three of said streams of trellis encoded channel symbols, and wherein said interleaving step causes there to be interleaved between each of the signal points of each channel symbol at least two signal points from other channel symbols of said streams of trellis encoded channel symbols.

13. The method of claim 11 wherein said channel symbols are 2N-dimensional channel symbols, $N>1$, and wherein said interleaving step causes every $N^{th}$ signal point in said interleaved signal point stream to be the $N^{th}$ signal point of a respective one of said channel symbols.

14. The method of claim 12 wherein said channel symbols are 2N-dimensional channel symbols, $N>1$, and wherein said interleaving step causes every $N^{th}$ signal point in said interleaved signal point stream to be the $N^{th}$ signal point of a respective one of said channel symbols.

15. A method for use in a modem, said method comprising the steps of
receiving a stream of input bits,
dividing said stream of input bits into a stream of uncoded bits and a plurality of streams of trellis bits,
independently trellis encoding each of said plurality of streams of trellis bits to generate respective streams of data words each identifying one of a plurality of predetermined subsets of the channel symbols of a predetermined 2N-dimensional constellation, N being an integer greater than unity, each of said channel symbols being comprised of a plurality of signal points,
selecting an individual channel symbol from each identified subset in response to said stream of uncoded bits to form a stream of channel symbols, and
generating a stream of output signal points, said signal point stream being comprised of the signal points of the selected channel symbols, the signal points of said signal point stream being sequenced in such a way that signal points that are either a) part of the same channel symbol, or b) part of channel symbols that are adjacent to one another in said channel symbol stream, are separated in said output stream by at least one other signal point.

16. The method of claim 15 wherein in said trellis encoding step a plurality of trellis encoder stages trellis encode respective ones of said streams of trellis bits.

17. The method of claim 15 wherein said selecting step includes the step of modulus converting said stream of uncoded bits.

18. The method of claim 15 wherein said channel symbols are 2N-dimensional channel symbols, $N>1$, and wherein said generating step causes every $N^{th}$ signal point in said stream of output signal points to be the $N^{th}$ signal point of a respective one of said channel symbols.

19. A method for use in a receiver to recover information from a received stream of trellis encoded signal points, said signal points having been transmitted to said receiver apparatus by a method which includes the steps of
generating a plurality of streams of trellis encoded channel symbols in response to respective portions of said information, each of said channel symbols being comprised of a plurality of signal points, and
interleaving the signal points of said generated channel symbols to form said stream of trellis encoded signal points, said interleaving being carried out in such a way that the signal points of each channel symbol are non-adjacent in said stream of trellis encoded signal points and such that the signal points of adjacent symbols in any one of said channel symbol streams are non-adjacent in said stream of trellis encoded signal points,
said method comprising the steps of
deinterleaving the interleaved signal points to recover said plurality of streams of trellis encoded channel symbols, and using a distributed Viterbi decoder to recover said information from the deinterleaved signal points.

20. The method of claim 19 wherein said receiver includes a phase tracking loop and wherein said method comprises the further step of adapting the operation of said phase tracking loop in response to minimum accumulated path metrics in said distributed Viterbi decoder.

21. Data communication apparatus comprising
means for receiving input information,
means for generating a plurality of streams of trellis encoded channel symbols in response to respective portions of said input information, each of said channel symbols being comprised of a plurality of signal points,
means for interleaving the signal points of said generated channel symbols to form a stream of trellis encoded signal points, said interleaving being carried out in such a way that the signal points of each channel symbol are non-adjacent in said stream of trellis encoded signal points and such that the signal points of adjacent symbols in any one of said channel symbol streams are non-adjacent in said stream of trellis encoded signal points,
means for applying the stream of trellis encoded signal points to a transmission channel,
means for receiving the stream of trellis encoded signal points from the channel,
means for deinterleaving the interleaved signal points to recover said plurality of streams of trellis encoded channel symbols, and
a distributed Viterbi decoder for recovering said information from the deinterleaved signal points.

22. The apparatus of claim 21 wherein said means for generating generates three of said streams of trellis encoded channel symbols, and wherein said means for interleaving causes there to be interleaved between each of the signal points of each channel symbol at least two signal points from other channel symbols of said streams of trellis encoded channel symbols.

23. The apparatus of claim 21 wherein said channel symbols are 2N-dimensional channel symbols, $N>1$, and wherein said means for interleaving causes every $N^{th}$ signal point in said interleaved signal point stream to be the $N^{th}$ signal point of a respective one of said channel symbols.

24. The apparatus of claim 22 wherein said channel symbols are 2N-dimensional channel symbols, $N>1$, and wherein said means for interleaving causes every $N^{th}$ signal point in said interleaved signal point stream to be the $N^{th}$ signal point of a respective one of said channel symbols.

* * * * *